United States Patent
Noh et al.

(10) Patent No.: US 8,048,701 B2
(45) Date of Patent: Nov. 1, 2011

(54) NITRIDE SEMICONDUCTOR LED USING A HYBRID BUFFER LAYER AND A FABRICATION METHOD THEREFOR

(75) Inventors: Youngkyn Noh, Daejeon (KR); Jae-Eung Oh, Kyunggy (KR)

(73) Assignee: Wooree Lst Co. Ltd (KR)

( * ) Notice: Subject to any disclaimer, the term of this patent is extended or adjusted under 35 U.S.C. 154(b) by 49 days.

(21) Appl. No.: 12/667,201

(22) PCT Filed: Feb. 5, 2009

(86) PCT No.: PCT/KR2009/000562
§ 371 (c)(1),
(2), (4) Date: Dec. 29, 2009

(87) PCT Pub. No.: WO2009/104874
PCT Pub. Date: Aug. 27, 2009

(65) Prior Publication Data
US 2010/0117057 A1    May 13, 2010

(30) Foreign Application Priority Data
Feb. 19, 2008  (KR) ................ 10-2008-0014819

(51) Int. Cl.
*H01L 21/00* (2006.01)
(52) U.S. Cl. .............. 438/47; 438/22; 257/E21.121
(58) Field of Classification Search .......... 438/47; 254/E21.121
See application file for complete search history.

(56) References Cited

U.S. PATENT DOCUMENTS

| | | | |
|---|---|---|---|
| 2006/0191474 A1* | 8/2006 | Chen et al. | 117/104 |
| 2008/0251890 A1* | 10/2008 | Park | 257/621 |
| 2008/0315222 A1* | 12/2008 | Kim et al. | 257/94 |
| 2009/0166649 A1* | 7/2009 | Lee | 257/94 |

FOREIGN PATENT DOCUMENTS

| | | |
|---|---|---|
| JP | 2002-118287 | 4/2002 |
| JP | 2008-16591 | 1/2008 |
| KR | 10-2005-0096509 | 10/2005 |

\* cited by examiner

*Primary Examiner* — Michael Lebentritt
*Assistant Examiner* — Daniel Whalen
(74) *Attorney, Agent, or Firm* — Husch Blackwell

(57) ABSTRACT

The present invention relates to a nitride semiconductor light emitting device using a hybrid buffer layer and a method for fabricating the same which can minimize the lattice mismatch between a buffer layer and a nitride semiconductor. The method for fabricating the nitride semiconductor light emitting device using the hybrid buffer layer includes a first step of forming an $Al_xGa_{1-x}N(0 \leqq x<1)$ layer on a substrate, a second step of forming a three-dimensional crystal seed layer made of a material included in a general formula of $Al_xGa_{1-x}N$ ($0 \leqq x<1$) and $AlO_yN_z$ on the substrate by recrystallizing the substrate with the $Al_xGa_{1-x}N(0 \leqq x<1)$ layer thereon, and a third step of forming an AlN nanostructure by annealing the substrate subjected to the second step at $NH_3$ gas atmosphere, thus forming a hybrid buffer layer composed of the three-dimensional crystal seed layer and the AlN nanostructure on the substrate.

9 Claims, 11 Drawing Sheets

NITRIDE SEMICONDUCTOR LED USING A HYBRID BUFFER LAYER AND A FABRICATION METHOD THEREFOR

CROSS REFERENCE TO RELATED APPLICATIONS

This application is a U.S. National Phase Application of International Application PCT Application No. PCT/KR2009/000562 filed on 5 Feb. 2009, which claims the benefit of priority from Korean Patent Application No. 10-2008-0014819 filed on 19 Feb. 2008. The disclosures of International Application PCT Application No. PCT/KR2009/000562 and Korean Patent Application No. 10-2008-0014819 are incorporated herein by reference.

TECHNICAL FIELD

The present invention relates to a nitride semiconductor light emitting device using a hybrid buffer layer and a method for fabricating the same, and more particularly, to a nitride semiconductor light emitting device using a hybrid buffer layer and a method for fabricating the same which can minimize the lattice mismatch between a buffer layer and a nitride semiconductor.

BACKGROUND ART

A light emitting device using a III-V nitride semiconductor, which can realize a blue-purple color and a blue-green color, has been applied to various fields such as flat panel displays, optical communication, etc.

Generally, the light emitting device using the III-V nitride semiconductor has a structure in which a nitride semiconductor is formed on a substrate. In the case of the light emitting device using the III-V nitride semiconductor, since the substrate and the nitride semiconductor have different lattice constants, if the nitride semiconductor is formed directly on the substrate, a defect concentration of the corresponding nitride semiconductor increases.

In order to solve the foregoing problem, a method for forming a buffer layer on a substrate prior to the stacking of a nitride semiconductor has been used to minimize defect generation during the succeeding nitride semiconductor formation. The process of forming the buffer layer will be described.

FIG. 1 is a sectional view explaining a conventional method for forming a buffer layer, and FIG. 2 is a photograph showing a surface of a substrate after the recrystallization during the formation of the conventional buffer layer.

The conventional buffer layer is formed by a process of forming low-temperature $Al_xGa_{1-x}N(0 \leq x<1)$ on the substrate and recrystallizing the low-temperature $Al_xGa_{1-x}N$ at ammonia ($NH_3$) gas atmosphere. As illustrated in FIG. 1, the buffer layer composed of three-dimensional $Al_xGa_{1-x}N$ ($0 \leq x<1$) seeds 102 in which the low-temperature $Al_xGa_{1-x}N$ has been recrystallized is formed on the substrate 101 via the above process.

Meanwhile, when the recrystallized three-dimensional $Al_xGa_{1-x}N$ seeds 102 are formed on the substrate 101, the corresponding recrystallized three-dimensional $Al_xGa_{1-x}N$ seeds 102 are not uniformly distributed over the entire substrate 101. Therefore, after the recrystallization, the buffer layer, i.e., the three-dimensional $Al_xGa_{1-x}N(0 \leq x<1)$ seeds 102 are formed in some areas of the substrate 101. Referring to FIG. 2, the three-dimensional $Al_xGa_{1-x}N(0 \leq x<1)$ seeds are not formed over the entire substrate, and the substrate is exposed as it is in the areas other than the areas in which the three-dimensional $Al_xGa_{1-x}N(0 \leq x<1)$ seeds have been formed.

In addition, the recrystallization of the low-temperature $Al_xGa_{1-x}N$ is performed at $NH_3$ gas atmosphere. The substrate in the areas in which the recrystallized three-dimensional $Al_xGa_{1-x}N$ seeds do not exist is reacted with $NH_3$ gas during the recrystallization. Normally, a sapphire ($Al_2O_3$) substrate is employed as the substrate. In this situation, the surface of the sapphire substrate is reacted with $NH_3$ gas, and thus $AlO_yN_z$ 103 is formed in some areas of the sapphire substrate as shown in FIG. 1.

The $AlO_yN_z$ 103 formed in some areas of the substrate during the recrystallization has the lattice mismatch with a nitride semiconductor 104 formed via the succeeding process. Such lattice mismatch degrades the crystallinity of the nitride semiconductor 104.

DISCLOSURE

Technical Problem

The present invention has been made in an effort to solve the above-described problems of the prior art, and an object of the present invention is to provide a nitride semiconductor light emitting device using a hybrid buffer layer and a method for fabricating the same which can minimize the lattice mismatch between a buffer layer and a nitride semiconductor.

Technical Solution

According to an aspect of the present invention for achieving the above object, there is provided a method for fabricating a nitride semiconductor light emitting device using a hybrid buffer layer, the method including: a first step of forming an $Al_xGa_{1-x}N(0 \leq x<1)$ layer on a substrate; a second step of forming a three-dimensional crystal seed layer made of a material included in a general formula of $Al_xGa_{1-x}N(0 \leq x<1)$ and $AlO_yN_z$ on the substrate by recrystallizing the substrate with the $Al_xGa_{1-x}N(0 \leq x<1)$ layer thereon; and a third step of forming an AlN nanostructure by annealing the substrate subjected to the second step at $NH_3$ gas atmosphere, thus forming a hybrid buffer layer composed of the three-dimensional crystal seed layer and the AlN nanostructure on the substrate.

Preferably, in the first step, the $Al_xGa_{1-x}N(0 \leq x<1)$ layer may be formed on the substrate at a process temperature of 300° C. to 600° C., and the $Al_xGa_{1-x}N(0 \leq x<1)$ layer may be formed at a thickness of 10 nm to 50 nm.

In addition, the second step is performed at $NH_3$ gas atmosphere and at a temperature of 1000° C. to 1400° C., and the surface of the sapphire substrate is reacted with $NH_3$ gas such that the $AlO_yN_z$ is formed on the surface of the sapphire substrate.

The third step is performed at a temperature relatively higher than the recrystallization temperature of the second step. Preferably, the temperature of the third step may be higher than that of the second step by 50° C. to 200° C., and the annealing time of the third step may range from 1 min. to 20 min. The method may further include a step of forming a compound semiconductor layer on the hybrid buffer layer after the third step. Moreover, after the third step, the entire area of the substrate is covered with the three-dimensional crystal seed layer and the AlN nanostructure.

The compound semiconductor layer is made of a III-V nitride semiconductor, preferably, a material formed by III-N combination.

In the meantime, there is provided a nitride semiconductor light emitting device using a hybrid buffer layer, including: a substrate; a hybrid buffer layer provided on the substrate; and a compound semiconductor layer provided on the hybrid buffer layer, wherein the hybrid buffer layer is composed of a combination of a three-dimensional crystal seed layer made of a material included in a general formula of $Al_xGa_{1-x}N$ ($0 \leq x < 1$) and an AlN nanostructure.

Advantageous Effects

The nitride semiconductor light emitting device using the hybrid buffer layer and the method for fabricating the same according to the present invention have the following advantage.

The lattice mismatch between the hybrid buffer layer and the nitride semiconductor layer is minimized to reduce a threading dislocation density and improve a crystal property of the nitride semiconductor layer.

BEST MODE FOR CARRYING OUT INVENTION

Hereinafter, a nitride semiconductor light emitting device using a hybrid buffer layer and a method for fabricating the same according to an embodiment of the present invention will be described in detail with reference to the accompanying drawings.

Figure 1:
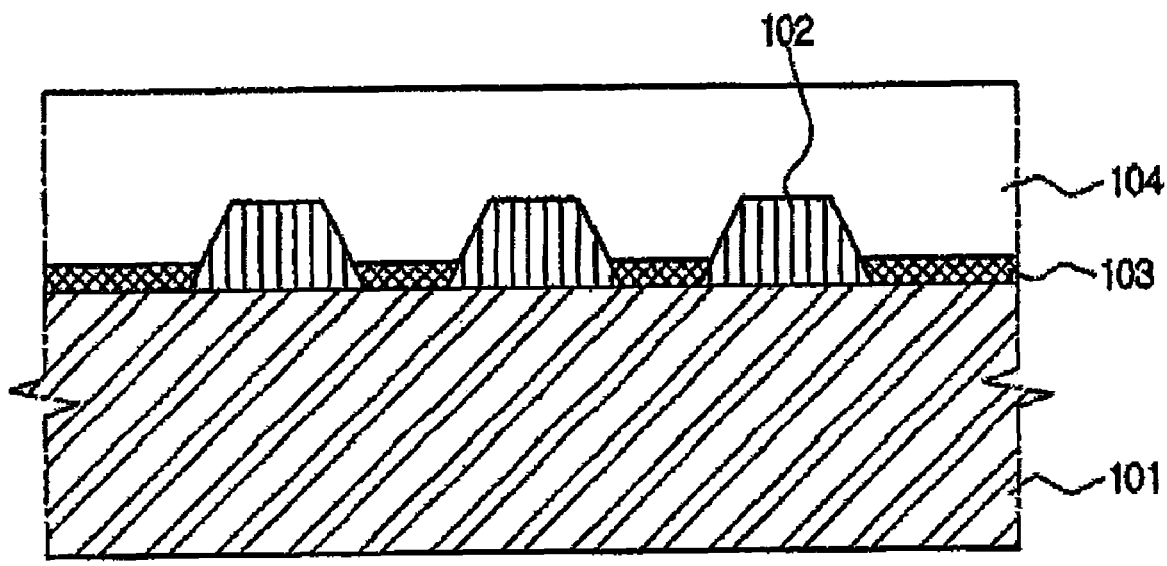
FIG. 1 is a sectional view explaining a conventional method for forming a buffer layer.
Figure 2:
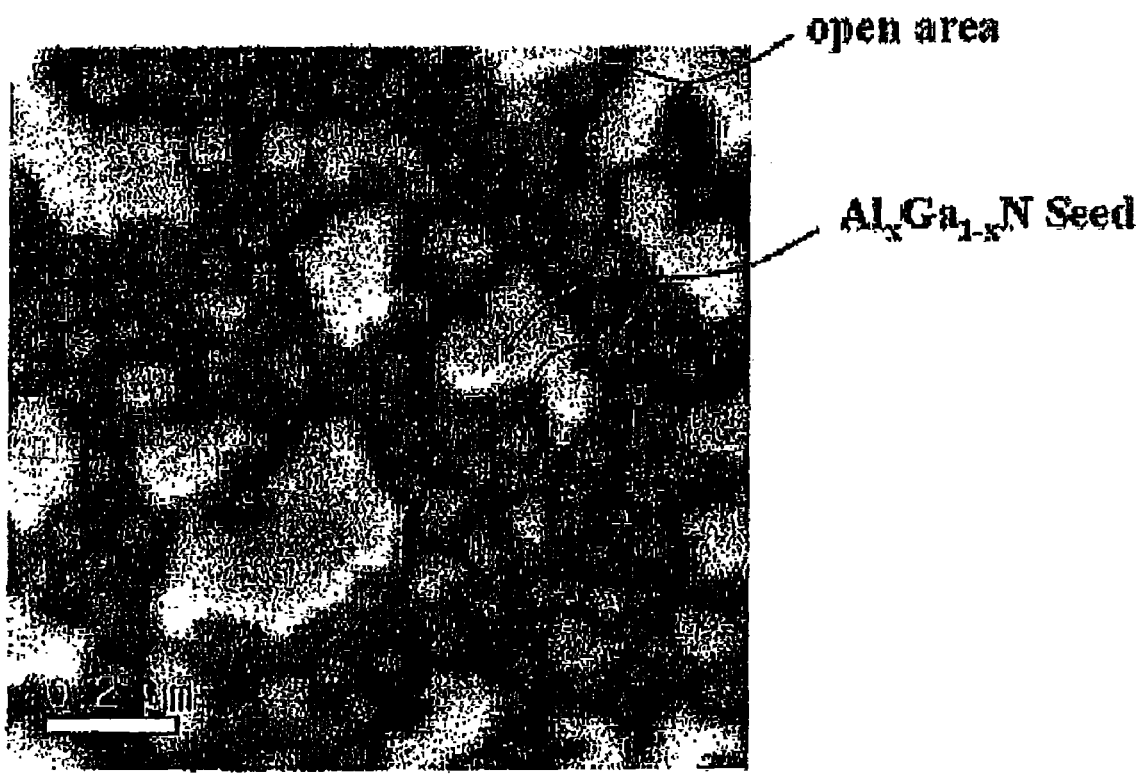
FIG. 2 is a photograph showing a surface of a substrate after the recrystallization during the formation of the conventional buffer layer.
Figure 3:
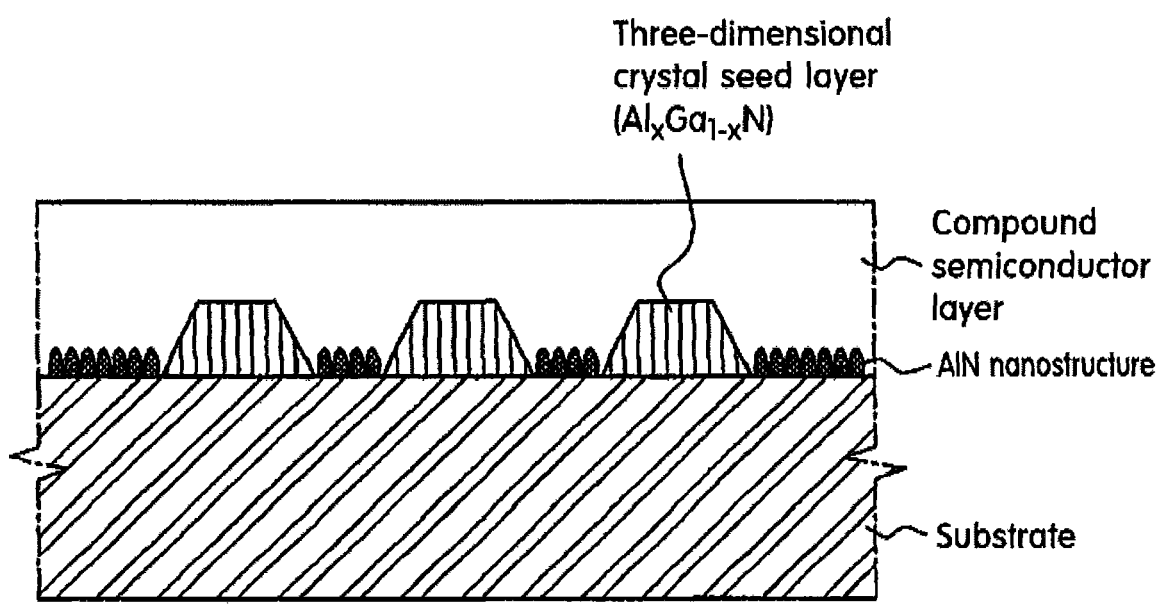
FIG. 3 is a sectional view of a nitride semiconductor light emitting device using a hybrid buffer layer according to an embodiment of the present invention.
Figure 4:
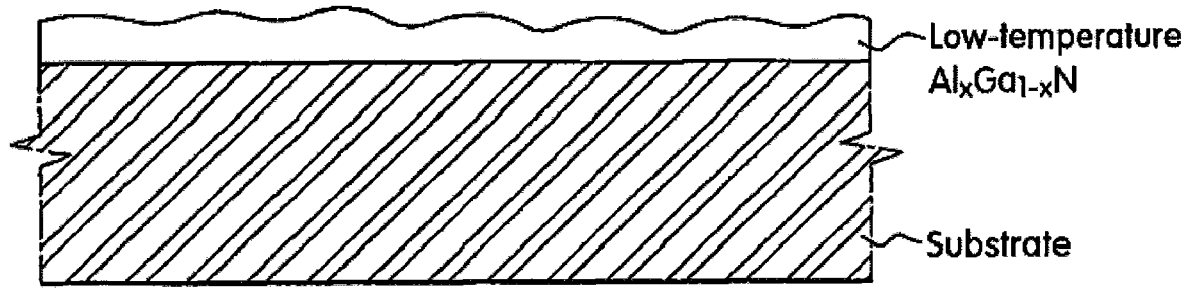
FIGS. 4 to 6 are process sectional views explaining a method for fabricating a nitride semiconductor light emitting device using a hybrid buffer layer according to an embodiment of the present invention.
Figure 5:
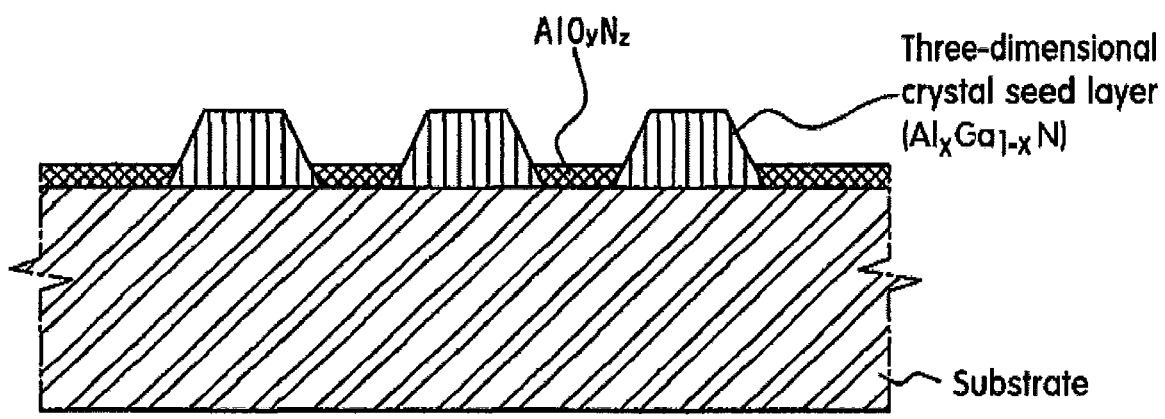
Figure 6:
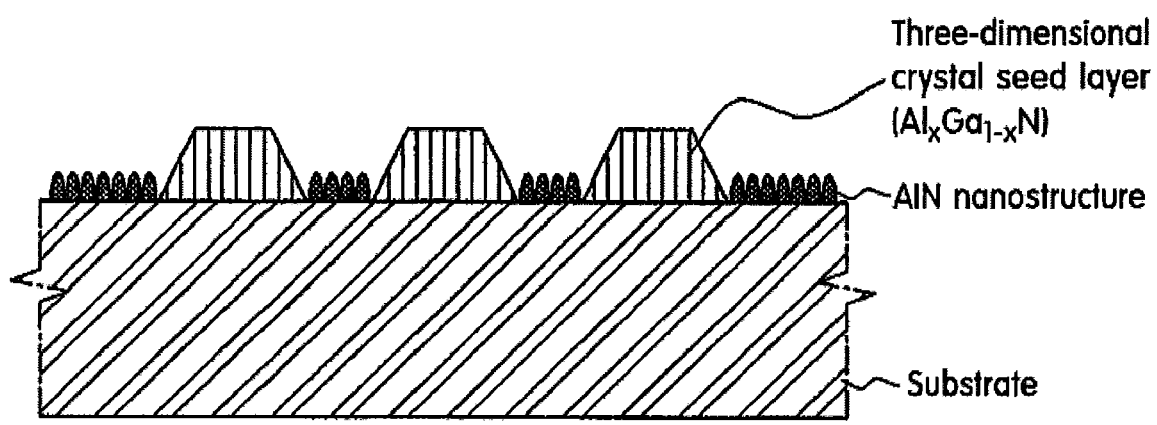

FIG. 3 is a sectional view of the nitride semiconductor light emitting device using the hybrid buffer layer according to the embodiment of the present invention, and FIGS. 4 to 6 are process sectional views explaining the method for fabricating the nitride semiconductor light emitting device using the hybrid buffer layer according to the embodiment of the present invention.

First, as illustrated in FIG. 3, the nitride semiconductor light emitting device using the hybrid buffer layer according to the present invention roughly includes a substrate, a hybrid buffer layer provided on the substrate, and a nitride semiconductor layer formed on the hybrid buffer layer.

The substrate may be a sapphire ($Al_2O_3$) substrate and the nitride semiconductor layer may be made of a III-V nitride semiconductor.

Meanwhile, the hybrid buffer layer is composed of a three-dimensional crystal seed layer made of a material included in a general formula of $Al_xGa_{1-x}N$ ($0 \leq x < 1$) and an AlN nanostructure. That is, the three-dimensional crystal seed layer made of the material included in the general formula of $Al_xGa_{1-x}N$ ($0 \leq x < 1$) and the AlN nanostructure coexist in the hybrid buffer layer.

In detail, the three-dimensional crystal seed layer ($Al_xGa_{1-x}N$ ($0 \leq x < 1$)) is provided in some areas of the substrate, and the AlN nanostructure is provided on the substrate in the areas in which the three-dimensional crystal seed layer does not exist. Here, some portions of the surface of the sapphire substrate are reacted with $NH_3$, thus forming the AlN nanostructure. The process of forming the AlN nanostructure will be described in detail below in association with the method for fabricating the nitride semiconductor light emitting device using the hybrid buffer layer.

The structure of the nitride semiconductor light emitting device using the hybrid buffer layer according to the embodiment of the present invention has been examined above.

Hereinafter, the method for fabricating the nitride semiconductor light emitting device using the hybrid buffer layer will be described.

The method for fabricating the nitride semiconductor light emitting device using the hybrid buffer layer according to the embodiment of the present invention is roughly divided into 1) the formation of low-temperature $Al_xGa_{1-x}N$ ($0 \leq x < 1$), 2) the recrystallization, and 3) the post-nitridation.

In detail, as illustrated in FIG. 4, a substrate is provided, and low-temperature $Al_xGa_{1-x}N$ ($0 \leq x < 1$) is formed on the substrate. Preferably, a sapphire ($Al_2O_3$) substrate is employed as the substrate.

The low-temperature $Al_xGa_{1-x}N$ ($0 \leq x < 1$) may be formed using a general stacking method such as metal organic chemical vapor deposition (MOCVD), molecular beam epitaxy (MBE), and so on. Preferably, a process temperature is low between 300° C. and 600° C. The thickness may range from 10 nm to 50 nm. Here, since the low-temperature $Al_xGa_{1-x}N$ ($0 \leq x < 1$) is formed at a low process temperature, the corresponding low-temperature $Al_xGa_{1-x}N$ ($0 \leq x < 1$) is deposited on the substrate in a non-crystallization state.

In a state where the low-temperature $Al_xGa_{1-x}N$ ($0 \leq x < 1$) has been formed, the recrystallization is performed on the corresponding substrate at a temperature of 1000° C. to 1400° C. and at $NH_3$ gas atmosphere. Therefore, as illustrated in FIG. 5, the low-temperature $Al_xGa_{1-x}N$ ($0 \leq x < 1$) on the substrate is crystallized into a three-dimensional crystal seed layer (a material included in a general formula of $Al_xGa_{1-x}N$ ($0 \leq x < 1$)). The low-temperature $Al_xGa_{1-x}N$ ($0 \leq x < 1$) is united during the recrystallization due to the lattice mismatch with the substrate, thereby forming the three-dimensional $Al_xGa_{1-x}N$ ($0 \leq x < 1$) seeds. Here, the sapphire substrate in the areas in which the three-dimensional low-temperature $Al_xGa_{1-x}N$ ($0 \leq x < 1$) seeds do not exist is reacted with the $NH_3$ gas, and thus $AlO_yN_z$ is formed on the sapphire substrate in the corresponding areas (refer to Chemical Reaction Formula 1 below).

$$Al_2O_3 + NH_3 \rightarrow 2AlO_yN_z + 3H_2O \qquad \text{<Chemical Reaction Formula 1>}$$

In a state where the three-dimensional crystal seed layer and $AlO_yN_z$ have been formed on the substrate via the recrystallization, the post-nitridation is performed. In detail, the substrate with the three-dimensional crystal seed layer and $AlO_yN_z$ thereon is annealed at a temperature higher than the recrystallization temperature, preferably, at a temperature higher than the recrystallization temperature by 50° C. to 200° C. Preferably, the atmosphere gas is $NH_3$ and the annealing time ranges from 1 min. to 20 min.

The $AlO_yN_z$ on the substrate is reacted with $NH_3$ via the post-nitridation. Accordingly, as illustrated in FIG. 6, an AlN nanostructure is formed on the substrate in the areas in which the three-dimensional crystal seed layer does not exist (refer to Chemical Reaction Formula 2 below).

$$AlO_yN_z + NH_3 \rightarrow AlN + H_2O \qquad \text{<Chemical Reaction Formula 2>}$$

A hybrid buffer layer composed of the three-dimensional crystal seed layer (the material included in the general formula of $Al_xGa_{1-x}N(0 \leq x < 1)$) and the AlN nanostructure is formed on the substrate via a series of processes including the formation of low-temperature $Al_xGa_{1-x}N(0 \leq x < 1)$, the recrystallization, and the post-nitridation. For information, a process in which the surface of the sapphire substrate is replaced by $Al_2O_3 \rightarrow AlO_yN_z \rightarrow AlN$ via the recrystallization and the post-nitridation can be seen in FIGS. 9 to 11.

Figure 9:
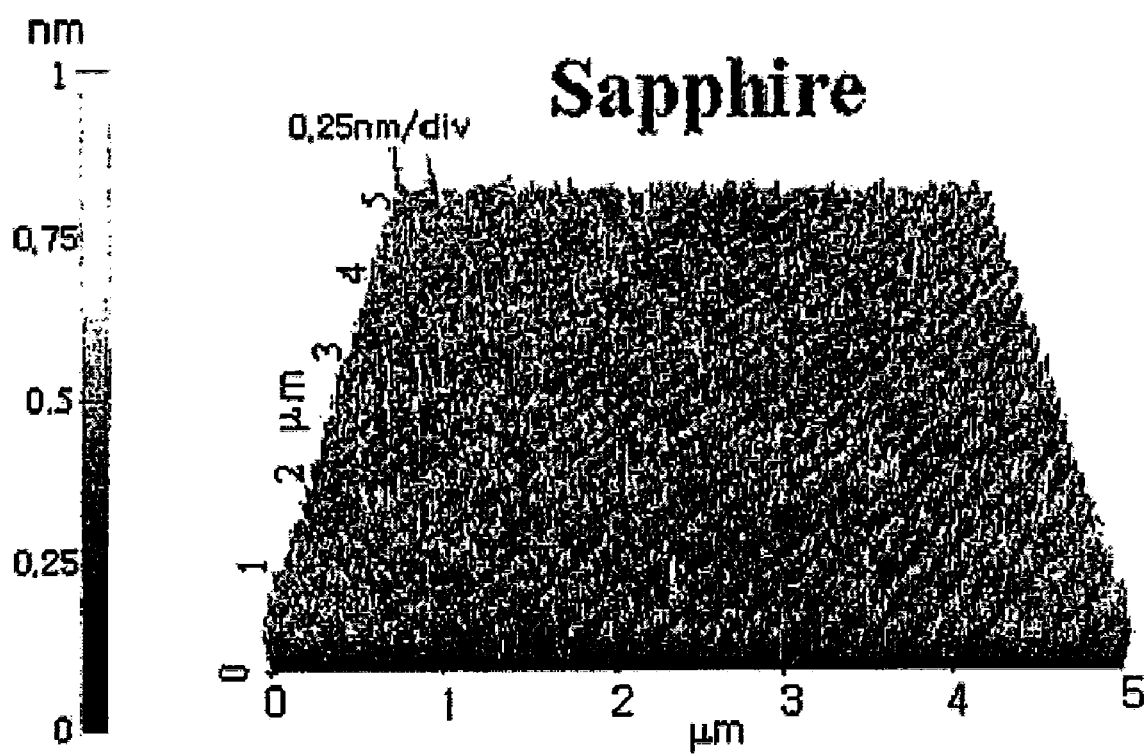
FIG. 9 is a photograph showing a surface of a sapphire substrate.
Figure 10:
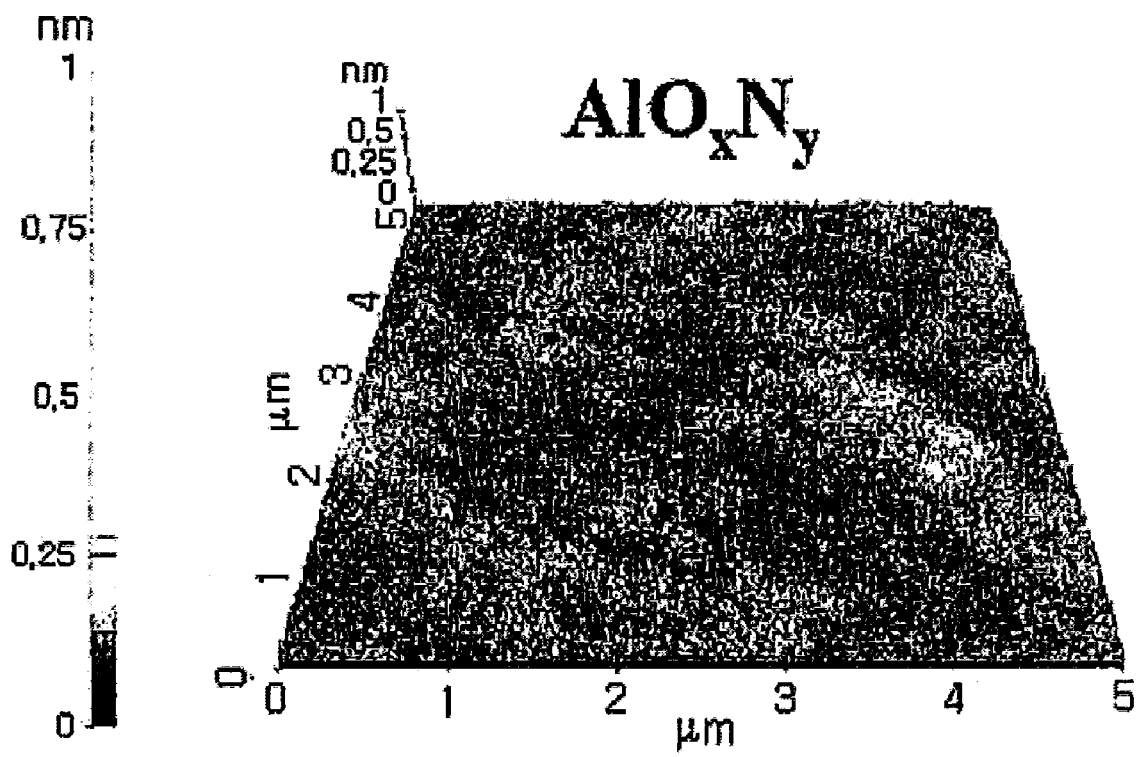
FIG. 10 is a photograph showing a state where $AlO_yN_z$ is formed on the sapphire substrate, after the sapphire substrate is recrystallized at $NH_3$ gas atmosphere and at 1150° C.
Figure 11:
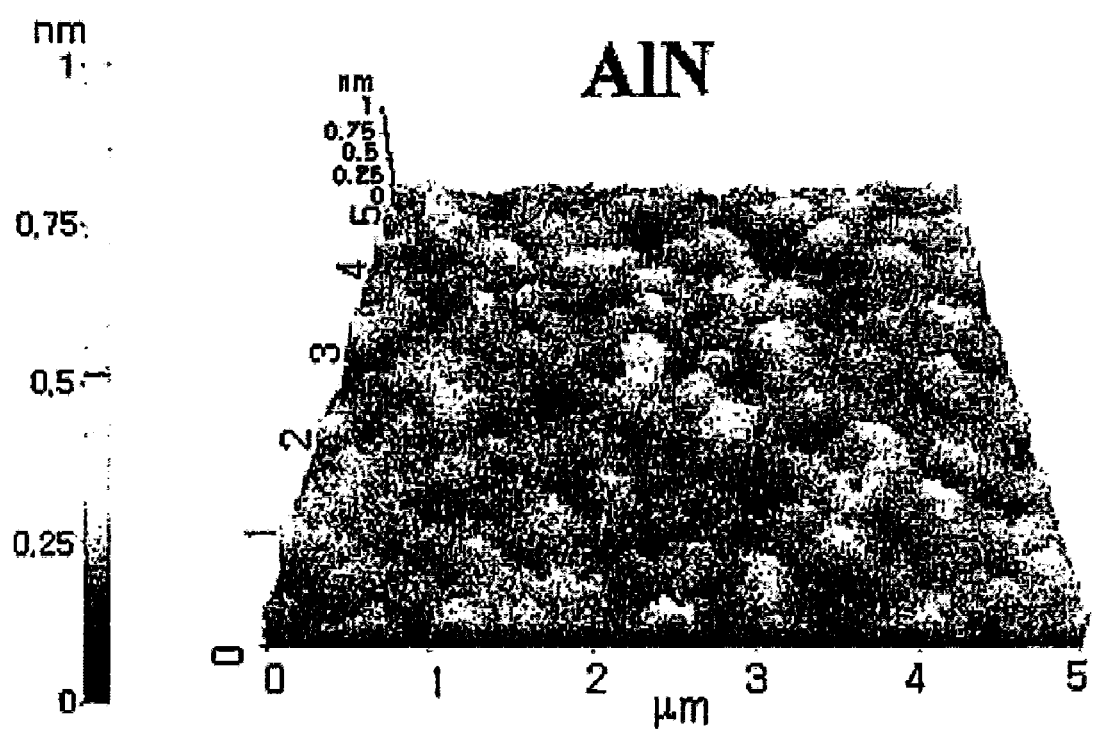
FIG. 11 is a photograph showing a state where an AlN nanostructure is formed on the sapphire substrate, after the sapphire substrate with the $AlO_yN_z$ thereon is annealed at $NH_3$ gas atmosphere and at 1200° C.

FIG. 9 is a photograph showing the surface of the sapphire substrate, FIG. 10 is a photograph showing a state where the $AlO_yN_z$ is formed on the sapphire substrate, after the sapphire substrate is recrystallized at $NH_3$ gas atmosphere and at 1150° C., and FIG. 11 is a photograph showing a state where the AlN nanostructure is formed on the sapphire substrate, after the sapphire substrate with the $AlO_yN_z$ thereon is annealed at $NH_3$ gas atmosphere and at 1200° C.

In a state where the hybrid buffer layer has been formed, a nitride semiconductor layer (not shown) such as a clad layer, an active layer and so on is formed on the hybrid buffer layer. Thus, the process for fabricating the nitride semiconductor light emitting device using the hybrid buffer layer according to the embodiment of the present invention is finished.

Meanwhile, in the nitride semiconductor light emitting device using the hybrid buffer layer according to the embodiment of the present invention, since the hybrid buffer layer is composed of the three-dimensional crystal seed layer and the AlN nanostructure, the lattice mismatch between the nitride semiconductor layer formed via the succeeding process and the hybrid buffer layer is minimized. The minimization of the lattice mismatch can be seen in FIGS. 7 and 8.

Figure 7:
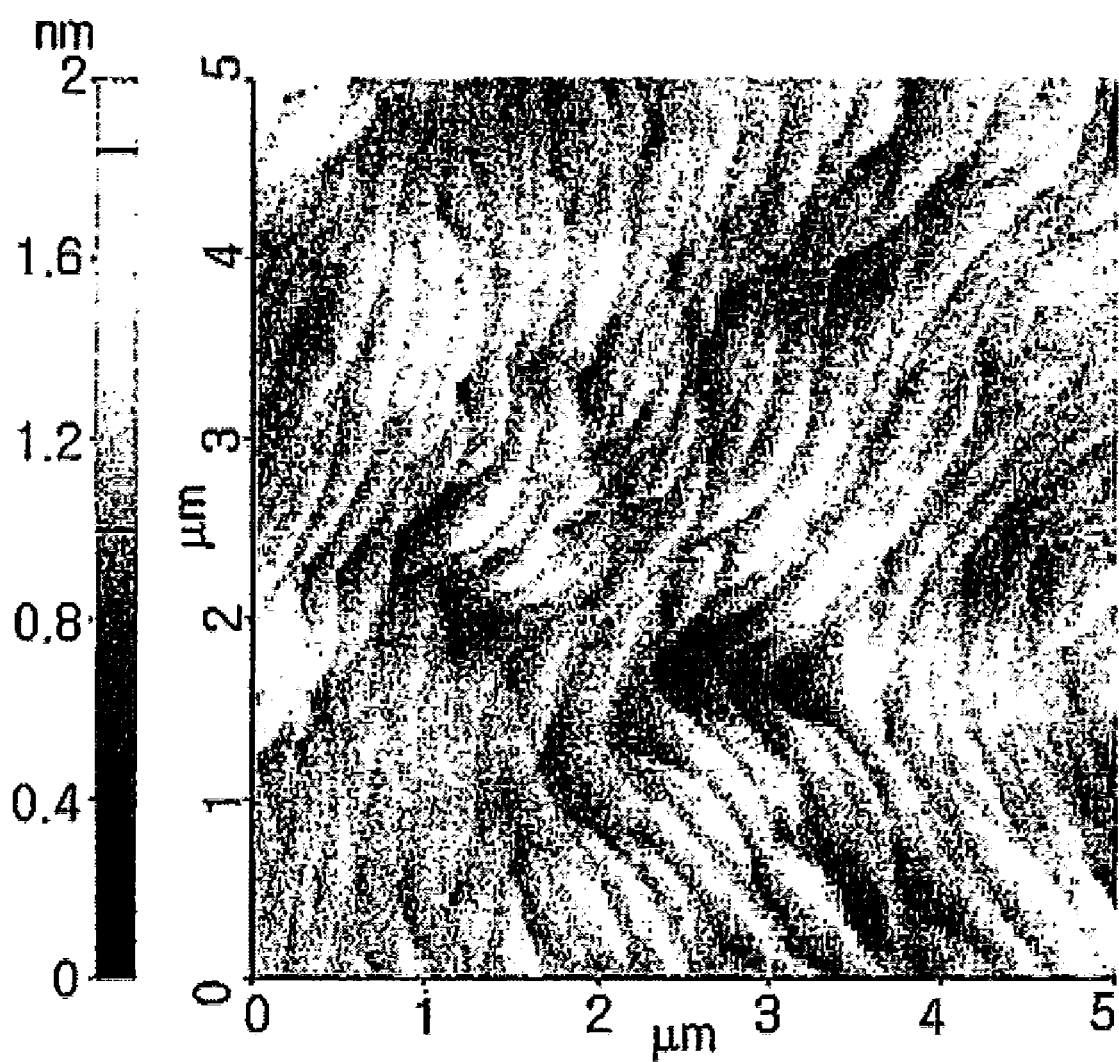
FIGS. 7 and 8 are photographs showing a surface of a nitride semiconductor layer (GaN) formed on the conventional buffer layer and a surface of a nitride semiconductor layer (GaN) formed on the hybrid buffer layer according to the embodiment of the present invention, respectively.
Figure 8:
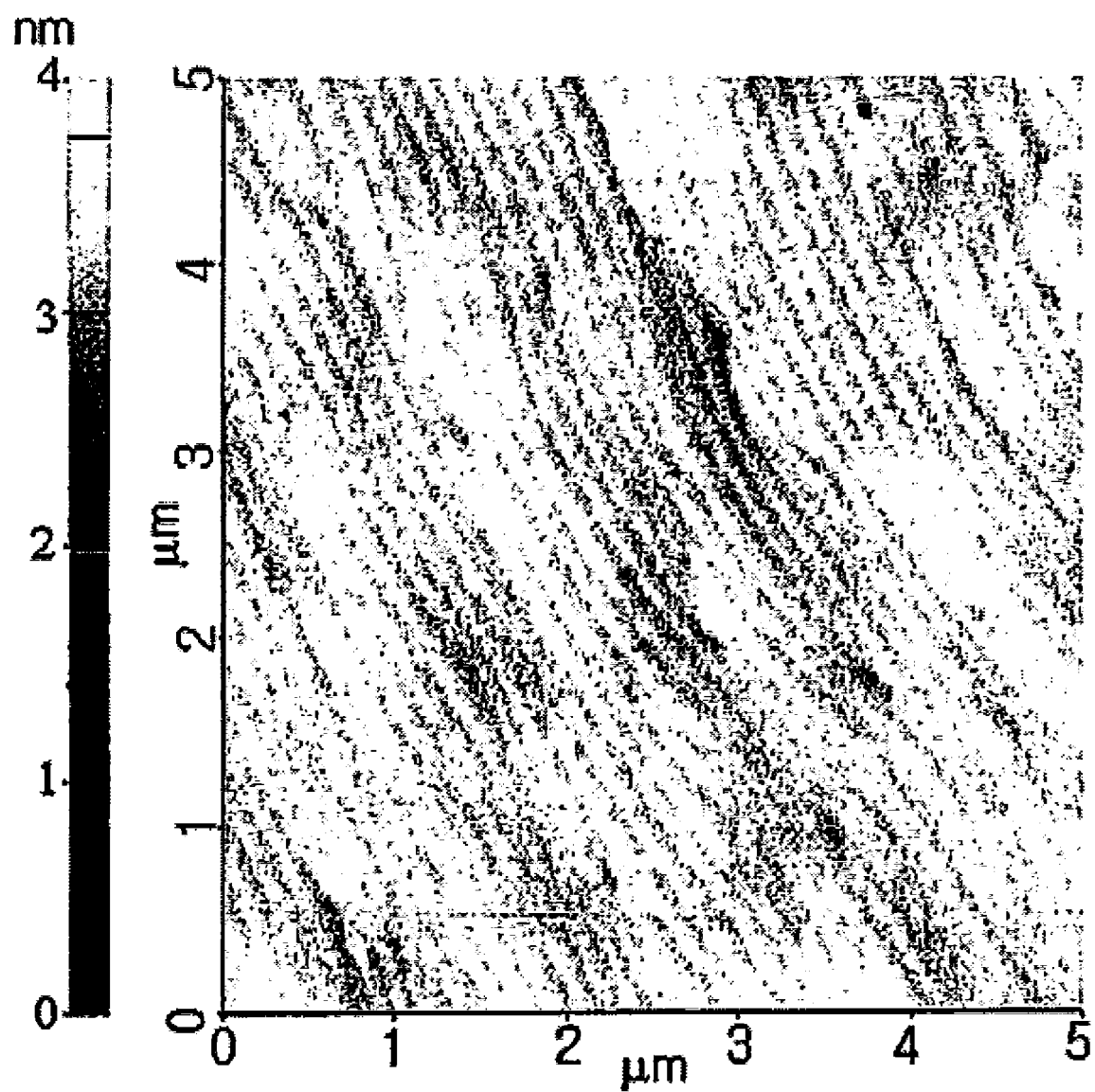

FIGS. 7 and 8 are photographs showing a surface of a nitride semiconductor layer (GaN) formed on the conventional buffer layer and a surface of a nitride semiconductor layer (GaN) formed on the hybrid buffer layer according to the embodiment of the present invention, respectively. The surface of the nitride semiconductor layer (GaN) formed on the hybrid buffer layer according to the embodiment of the present invention as shown in FIG. 8 is more uniform than the surface of the nitride semiconductor layer (GaN) formed on the conventional buffer layer as shown in FIG. 7. Therefore, the nitride semiconductor layer (GaN) formed on the hybrid buffer layer of the present invention has a relatively low defect concentration, and thus has an excellent crystal property. In addition, it can be appreciated that the lattice mismatch between the hybrid buffer layer according to the embodiment of the present invention and the nitride semiconductor layer stacked thereon is minimized.

It can be seen from another experiment result that the nitride semiconductor stacked on the hybrid buffer layer according to the embodiment of the present invention has an excellent crystal property. The following Table 1 shows the threading dislocation density and the electron mobility of the conventional light emitting device and the light emitting device fabricated according to the embodiment of the present invention.

TABLE 1

| Characteristics of conventional light emitting device and inventive light emitting device | | |
|---|---|---|
| | Prior art | Present invention |
| Threading dislocation density (EA/cm²) | 3.44 × 10⁸ | 1.0 × 10⁸ |
| Electron mobility(cm²/Vs)   300K | 97 | 516 |
| 77K | 80 | 1016 |

As shown in Table 1, while the conventional light emitting device using the general buffer layer has a threading dislocation density of $3.44 \times 10^8$ EA/cm², the light emitting device using the hybrid buffer layer of the present invention has a threading dislocation density of $1.0 \times 10^8$ EA/cm². The threading dislocation density is reduced by over 70% compared with the prior art. Moreover, while the conventional light emitting device has an electron mobility of 97 cm²/Vs at 300 K and 80 cm²/Vs at 77 K, the inventive light emitting device has an electron mobility of 516 cm²/Vs at 300 K and 1016 cm²/Vs at 77 K. The electron mobility is remarkably improved compared with the prior art. It can be seen from the above experiment result that the hybrid buffer layer of the present invention can improve the crystal property of the nitride semiconductor layer stacked thereon.

INDUSTRIAL APPLICABILITY

The nitride semiconductor light emitting device using the hybrid buffer layer according to the present invention can be widely used in various fields such as flat panel displays, traffic lights, indoor lighting, high-definition output systems, optical communication, etc.

The invention claimed is:

1. A method for fabricating a nitride semiconductor light emitting device using a hybrid buffer layer, the method comprising:
    a first step of forming an $Al_xGa_{1-x}N(0 \leq x \leq 1)$ layer on a sapphire ($Al_2O_3$) substrate;
    a second step of forming a three-dimensional crystal seed layer and $AlO_yN_z$ by recrystallizing under $NH_3$ gas atmosphere said sapphire ($Al_2O_3$) substrate on which said $Al_xGa_{1-x}N(0 \leq x < 1)$ layer is formed, said crystal seed layer being made of a material represented by a general formula of $Al_xGa_{1-x}N(0 \leq x < 1)$, said $AlO_yN_z$ being formed by reaction of a surface of said sapphire ($Al_2O_3$) substrate with $NH_3$ gas; and
    a third step of forming an AlN nanostructure by annealing the sapphire ($Al_2O_3$) substrate under $NH_3$ gas atmosphere after said second step so as to form the hybrid buffer layer composed of the three-dimensional crystal seed layer and the AlN nanostructure, both formed on the sapphire ($Al_2O_3$) substrate.

2. The method of claim 1, wherein, in the first step, the $Al_xGa_{1-x}N(0 \leq x < 1)$ layer is formed on the sapphire ($Al_2O_3$) substrate at a process temperature of 300° C. to 600° C.

3. The method of claim 1, wherein, after the completion of the first step, the $Al_xGa_{1-x}N(0 \leq x < 1)$ layer does not exist in some areas of the sapphire ($Al_2O_3$) substrate.

4. The method of claim 1, wherein the second step is performed at a temperature of 1000° C. to 1400° C.

5. The method of claim 4, wherein the temperature of the third step is higher than that of the second step by 50° C. to 200° C.

6. The method of claim 1, wherein a time of the annealing said sapphire ($Al_2O_3$) substrate in the third step ranges from 1 min. to 20 min.

7. The method of claim 1, wherein, in the first step, the $Al_xGa_{1-x}N(0 \leqq x < 1)$ layer is formed at a thickness of 10 nm to 50 nm.

8. The method of claim 1, further comprising a step of forming a nitride semiconductor layer on the hybrid buffer layer after the third step.

9. The method of claim 1, wherein, after the third step, the entire area of the sapphire ($Al_2O_3$) substrate is covered with the three-dimensional crystal seed layer and the AlN nanostructure.

* * * * *